(12) United States Patent
Nguyen et al.

(10) Patent No.: US 10,240,250 B2
(45) Date of Patent: Mar. 26, 2019

(54) METHOD TO PROVIDE A PATTERNED ORIENTATION TEMPLATE FOR A SELF-ASSEMBLABLE POLYMER

(71) Applicant: ASML Netherlands B.V., Veldhoven (NL)

(72) Inventors: Thanh Trung Nguyen, Eindhoven (NL); Jozef Maria Finders, Veldhoven (NL); Wilhelmus Sebastianus Marcus Maria Ketelaars, Eindhoven (NL); Sander Frederik Wuister, Eindhoven (NL); Eddy Cornelis Antonius Van der Heijden, Netersel (NL); Hieronymus Johannus Christiaan Meessen, Eindhoven (NL); Roelof Koole, Eindhoven (NL); Emiel Peeters, Eindhoven (NL); Christianus Martinus Van Heesch, Eindhoven (NL); Aurelie Marie Andree Brizard, Eindhoven (NL); Henri Marie Joseph Boots, Best (NL); Tamara Druzhinina, Eindhoven (NL); Jessica Margaretha De Ruiter, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 530 days.

(21) Appl. No.: 14/345,891

(22) PCT Filed: Oct. 2, 2012

(86) PCT No.: PCT/EP2012/069400
§ 371 (c)(1),
(2) Date: Mar. 19, 2014

(87) PCT Pub. No.: WO2013/050338
PCT Pub. Date: Apr. 11, 2013

(65) Prior Publication Data
US 2014/0245948 A1   Sep. 4, 2014

Related U.S. Application Data

(60) Provisional application No. 61/601,439, filed on Feb. 21, 2012, provisional application No. 61/542,498, (Continued)

(51) Int. Cl.
*C30B 1/12* (2006.01)
*B81C 1/00* (2006.01)
(Continued)

(52) U.S. Cl.
CPC ............ *C30B 1/12* (2013.01); *B81C 1/00031* (2013.01); *G03F 7/0002* (2013.01);
(Continued)

(58) Field of Classification Search
CPC combination set(s) only.
See application file for complete search history.

(56) References Cited

U.S. PATENT DOCUMENTS

2007/0105051 A1* 5/2007 Kawakami ............ G03F 1/144
430/311
2007/0175859 A1   8/2007 Black et al.
(Continued)

FOREIGN PATENT DOCUMENTS

CN   101602481   12/2009
CN   101916039   12/2010
(Continued)

OTHER PUBLICATIONS

International Search Report dated Feb. 21, 2013 in corresponding International Patent Application No. PCT/EP2012/069400.
(Continued)

*Primary Examiner* — Erin F Bergner
(74) *Attorney, Agent, or Firm* — Pillsbury Winthrop Shaw Pittman LLP

(57) ABSTRACT

A graphoepitaxy template to align a self-assembled block polymer adapted to self-assemble into a 2-D array having parallel rows of discontinuous first domains extending parallel to a first axis, mutually spaced along an orthogonal second axis, and separated by a continuous second domain. The graphoepitaxy template has first and second substantially parallel side walls extending parallel to and defining the first axis and mutually spaced along the second axis to provide a compartment to hold at least one row of discontinuous first domains of the self-assembled block copolymer on the substrate between and parallel to the side walls, and separated therefrom by a continuous second domain. The compartment has a graphoepitaxial nucleation feature arranged to locate at least one of the discontinuous first domains at a specific position within the compartment. Methods for forming the graphoepitaxy template and its use for device lithography are also disclosed.

23 Claims, 10 Drawing Sheets

Related U.S. Application Data filed on Oct. 3, 2011, provisional application No. 61/578,637, filed on Dec. 21, 2011.

(51) Int. Cl.
  *G03F 7/00*   (2006.01)
  *B82Y 30/00*  (2011.01)
  *H01L 21/033* (2006.01)

(52) U.S. Cl.
  CPC ....... *B81C 2201/0149* (2013.01); *B82Y 30/00* (2013.01); *H01L 21/0337* (2013.01); *Y10T 117/10* (2015.01)

(56) References Cited

U.S. PATENT DOCUMENTS

| | | | |
|---|---|---|---|
| 2008/0311347 A1* | 12/2008 | Millward | B81C 1/00031 428/144 |
| 2009/0274887 A1* | 11/2009 | Millward | B81C 1/00031 428/221 |
| 2010/0316849 A1 | 12/2010 | Millward et al. | |

FOREIGN PATENT DOCUMENTS

| | | |
|---|---|---|
| CN | 101971093 | 2/2011 |
| CN | 101989047 | 3/2011 |
| JP | 2008090956 | 4/2008 |
| JP | 2010522643 | 7/2010 |
| WO | 2008/091741 | 7/2008 |
| WO | 2012/106121 | 8/2012 |

OTHER PUBLICATIONS

Mark P. Stoykovich et al., "Directed Assembly of Block Copolymer Blends into Nonregular Device-Oriented Structures," Science, vol. 308, No. 5727, pp. 1442-1446 (Jun. 3, 2005).
Joy Y. Cheng et al., "Templated Self-Assembly of Block Copolymers: Effect of Substrate Topography," Advanced Materials, vol. 15, No. 19, pp. 1599-1602 (Oct. 2, 2003).
Korean Office Action issued in corresponding Korean Patent Application No. 10-2014-7012173, dated Dec. 3, 2018.

* cited by examiner

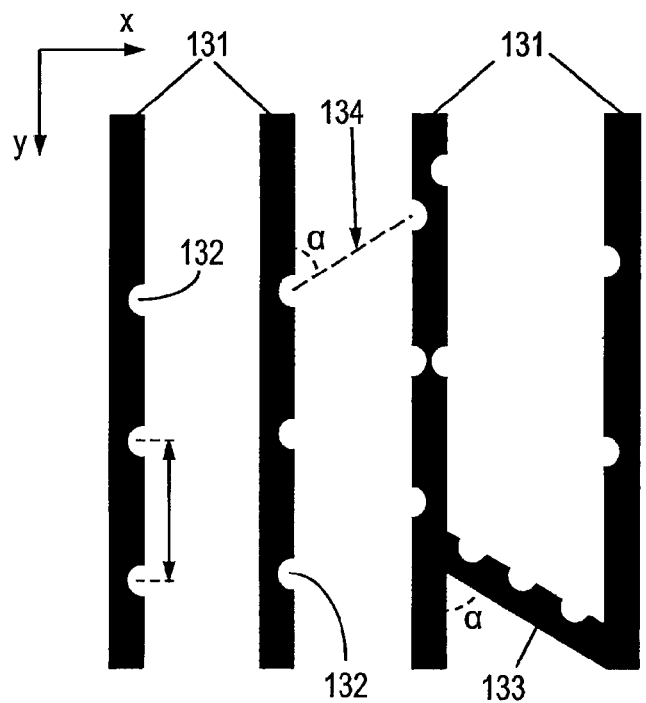
Fig. 13
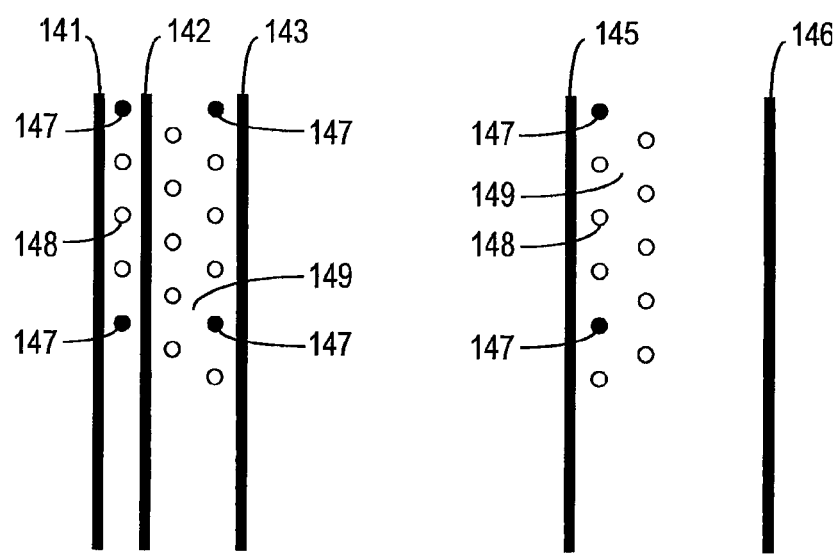
Fig. 14A  Fig. 14B

METHOD TO PROVIDE A PATTERNED ORIENTATION TEMPLATE FOR A SELF-ASSEMBLABLE POLYMER

CROSS-REFERENCE TO RELATED APPLICATIONS

This application is the U.S. national phase entry of PCT patent application no. PCT/EP2012/069400, filed Oct. 2, 2012, which claims the benefit of U.S. Provisional Application No. 61/542,498, which was filed on Oct. 3, 2011, and U.S. Provisional Application No. 61/578,637, which was filed on Dec. 21, 2011, and U.S. Provisional Application No. 61/601,439, which was filed on Feb. 21, 2012, and which is incorporated herein in its entirety by reference.

FIELD

The present invention relates to a graphoepitaxy template on a substrate, to align a self-assembled block polymer on a surface of the substrate and to a method of forming such a graphoepitaxy template. The invention also relates to formation of a self-assembled polymer layer on such a substrate and a method of device lithography using a resist layer of self-assembled polymer such as a block copolymer deposited and assembled on such a substrate provided with a graphoepitaxy template.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of a surface, for example of an imprint template or of another substrate and a chemical resist may be used to achieve this.

The use of self-assembly of a block copolymer (BCP) has been considered as a potential method for improving the resolution to a better value than obtainable by prior art lithography methods or as an alternative to electron beam lithography for preparation of imprint templates.

Self-assemblable block copolymers are compounds useful in nanofabrication because they may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer (A-B-C) may be useful, as may an alternating or periodic block copolymer (e.g. $[-A-B-A-B-A-B-]_n$ or $[-A-B-C-A-B-C]_m$ where n and m are integers). The blocks are connected to each other by covalent links in a linear or branched fashion (e.g. star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the numbers of phases. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes parallel or perpendicular to the substrate and lamellar and cylindrical phases are interesting for lithography applications, as they may form line and spacer patterns and hole arrays, respectively, and may provide good contrast when one of the domain types is subsequently etched.

Two methods used to guide or direct self-assembly of a polymer such as a block copolymer onto a surface are graphoepitaxy and chemical pre-patterning, also called chemical epitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In the chemical pre-patterning method (referred to herein as chemical epitaxy), the self-assembly of block copolymer domains is guided by a chemical pattern (i.e. a chemical template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical pattern comprises a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of pre-patterned features on the substrate (so-called density multiplication). Chemical pre-patterning is not limited to a linear pre-pattern; for instance the pre-pattern may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases, where the different domain types are arranged side-by-side on a surface of a substrate.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between domains of different blocks lying substantially perpendicular to the plane of the surface.

A neutral surface is useful in chemical epitaxy and graphoepitaxy. It may be used on a surface between specific orientation regions of an epitaxy template. For instance in a chemical epitaxy template for aligning a di-block copolymer with A and B blocks, where A is hydrophilic and B is hydrophobic in nature, the chemical pattern may comprise hydrophobic pinning regions with a neutral orientation region between the hydrophobic regions. The B domain may preferentially assemble onto the hydrophobic pinning regions, with several alternating domains of A and B blocks aligned over the neutral region between the specific (pinning) orientation regions of the chemical pre-pattern.

For instance in a graphoepitaxy template for aligning such a di-block copolymer the pattern may comprise hydrophobic resist features with a neutral orientation region between the hydrophobic resist features. The B domain may preferentially assemble alongside the hydrophobic resist features, with several alternating domains of A and B blocks aligned over the neutral orientation region between the specific (pinning) orientation resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to 40 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable polymer may be deposited onto the substrate, onto a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered NB domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperature up to a few ° C. above or below the order/disorder temperature $T_{OD}$ for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare. Other methods of transferring a pattern, known in the art, may be applicable to a pattern formed by self-assembly of a block copolymer.

PCT patent application publication no. WO 2008/091714 discloses methods for fabricating sublithographic nanoscale microstructures in two-dimensional square and rectangular arrays using self-assembling block copolymers. The graphoepitaxy features disclosed comprise a plurality of open-ended trenches formed between substantially parallel side walls with the ends of the trenches aligned. The sidewalls and ends of the trenches preferentially wet one of the polymer domains, with the floor acting as a neutral-wetting surface.

In a self-assembled block copolymer system, a defect is likely to be present for various reasons. If ordering of the domains forming the self-assembled array from the block copolymer initiates from different nucleation sites on a surface of a substrate, mismatches in structure of the resulting final assembly may result. Typical examples of defects include a discontinuity in an assembled pattern and/or a dislocation or missing unit in a pseudo-crystalline arrangement (for example, a missing cylinder in a hexagonal phase pattern). Apart from defectivity, a placement error arising from deviation from a perfect grid of highly repetitive features is an obstacle hampering the use of self-assembled block copolymer, especially for circumstances where ordered phases such as cylindrical phase or cubic phase or tetragonal phase are used to provide a 2-D array of features, for instance of use for the provision of contacts on a substrate.

For a self-assembled block copolymer providing a two-dimensional (2-D) array on a substrate, there will typically be parallel rows of discontinuous first domains extending parallel to a Cartesian y axis separated from each other by a continuous second domain. Typically there will be no periodicity normal to the surface of the substrate (i.e. along the Cartesian z axis). Orientation of the parallel rows can be achieved between the sidewalls of trenches formed between graphoepitaxial side walls, defining the Cartesian y axis, on a substrate. However, the placement of the discontinuous domains along the y axis may not be well controlled. For a cylindrical self-assembled phase, the discontinuous first domains will be the cylinders and adjacent rows parallel to the y axis will have the cylinders offset relative to each other so that parallel rows of cylinders will lie at 60° to the rows of cylinders aligned parallel to the y axis.

For many applications, such as nanofabrication of integrated circuits (ICs) and hard drives, the placement error of such a discontinuous domain should be small (say 3 nm or less). The placement error can be quantified by determining the deviation of the actual discontinuous domain from the corresponding perfect grid-points of a hypothetical perfect self-assembled 2-D array.

Hence, it is desirable to provide a method which may precisely control the placement of the discontinuous first domains of self-assembled block copolymer. It is also desirable to provide a methods which results in only small variation in pitch along the y axis direction, in other words helping to ensuring that the discontinuous first domains are precisely evenly spaced along the y axis direction.

It is desirable, for example, to provide a graphoepitaxy template on a substrate surface, for use in guiding a self-assembled layer of block copolymer which is arranged to self-assemble into a 2-D array on the substrate surface for use as resist layer suitable for use in device lithography, which addresses or overcomes one or more of problems in the art. In particular, it is desirable, for example, to provide a graphoepitaxy template which enables accurate placement of such a 2-D array relative to the substrate.

Whenever appropriate, the use of the term "comprises" or "comprising" may also be taken to include the meaning "consists essentially of" or "consisting essentially of" and to also include the meaning "consists of" or "consisting of".

According to an aspect of the invention, there is provided a graphoepitaxy template on a substrate, to align a self-assembled block polymer on a surface of the substrate, wherein the block copolymer is adapted to self-assemble into a 2-D array comprising parallel rows of discontinuous first domains extending parallel to a Cartesian y axis, mutually spaced along an orthogonal Cartesian x axis, and separated by a continuous second domain, the graphoepitaxy template comprising:

first and second substantially parallel side walls extending parallel to and defining the y axis and mutually spaced along the x axis to provide a compartment adapted to hold at least one row of discontinuous first domains on the substrate between and parallel to the side walls, and separated therefrom by the continuous second domain, wherein the compartment comprises a graphoepitaxial nucleation feature arranged to locate at least one of the discontinuous first domains at a specific position within the compartment.

This aspect is concerned with a graphoepitaxy template on a substrate. The template is for aligning a self-assembled block polymer on a surface of the substrate, wherein the block copolymer is adapted to self-assemble into a 2-D array comprising parallel rows of discontinuous first domains extending parallel to a Cartesian y axis, mutually spaced along an orthogonal Cartesian x axis, and separated by a continuous second domain. The discontinuous first domains will contain one of the polymer blocks of the block copolymer, with the second continuous domain containing one of the other blocks.

The graphoepitaxy template comprises first and second substantially parallel side walls extending parallel to and defining the Cartesian y axis and mutually spaced along the x axis, set orthogonal (i.e. at 90° to the y axis) to provide a compartment adapted to hold at least one row of discontinuous first domains on the substrate between and parallel to the side walls, and separated therefrom by the continuous second domain.

For instance, if the block copolymer is adapted to form a cylindrical phase upon self-assembly of a thin layer on a surface of a substrate, with the cylinders lying with their long axes normal to the surface of the substrate, then the cylinders will be the discontinuous first domains with a second continuous domain between them. The cylinders will be arranged to form in a row or rows parallel to the side walls.

Typically, the self-assembled array may be arranged with the rows of discontinuous first domains spaced apart having a pitch $L_x$ measured along the x-axis with the discontinuous domains within each row spaced apart having a pitch $L_y$ as measured along the y axis. The parallel side walls may be suitably spaced apart so that there is at least one row of discontinuous first domains lying parallel to the y axis, say from 1 to 20, such as 2 to 10. The applicable spacing will be determinable from a knowledge of the pitch of the spacing between the discontinuous first domains, which may be measured, for instance, by electron microscopy. However, it may be that the spacing between the parallel side walls is not exactly n. $L_x$, where n is an integer, say from 1 to 20, depending upon exactly how the block copolymer is arranged at the side walls. For instance, the spacing required may be (n·$L_x$+2·d), where d represents the thickness of a transitional region at the parallel side walls. The value of d may be measured for any particular arrangement of side walls and block copolymer by plotting the measured pitch as a function of the spacing between the parallel side walls as the spacing between the parallel side walls is varied systematically. For instance, for some block copolymers, the value of d may be about 5 nm. Such a transitional region may also be referred to using the term "dead zone". When designing the dimensions of the a graphoepitaxy template according to an embodiment of the invention, one or more such transitional regions or "dead zones" should be taken into account appropriately.

The compartment defined by the parallel side walls comprises a graphoepitaxial nucleation feature arranged to locate at least one of the discontinuous first domains at a specific position within the compartment. In other words, in addition to being part of a row of discontinuous domains located parallel to the side walls, at least one of the discontinuous first domains is positionally located along the y axis at a position determined by the graphoepitaxial nucleation feature.

By "substantially parallel" it is meant that the side walls are parallel along their lengths save for minor deviations, such as may be caused by the presence of the graphoepitaxial nucleation feature in the compartment.

Typically, the side walls of the graphoepitaxy template will be such that they have a high chemical affinity for the discontinuous first domains and a low chemical affinity for the continuous second domain of the assembled block copolymer. However, the situation may be reversed, with the side walls having a low chemical affinity for the discontinuous first domains and a high chemical affinity for the second continuous domain. The spacing between the side walls will be such that the self-assembled block copolymer may take on its equilibrium state within the walls without undue strain. Hence, if the discontinuous first domains are of PMMA, then the material of the side walls may be selected to be a material with a high chemical affinity for PMMA, e.g., which will be wetted by PMMA, such as hydrogen silsesquioxane.

In order to encourage the discontinuous first domains to align with their long axes normal to the surface of the substrate, the surface of the substrate may suitably have a neutral chemical affinity towards both the discontinuous first domains and the second continuous domain.

In a suitable arrangement, the graphoepitaxial nucleation feature may be an alcove in the first side wall and/or second side wall. The alcove may be shaped to hold at least one discontinuous first domain therein.

In another suitable arrangement, the graphoepitaxial nucleation feature may be a buttress extending into the compartment from the first side wall. The buttress may be of a similar thickness to the side wall from which it extends into the compartment and may be formed continuously with the side wall. The buttress may extend towards the second side wall to provide a partition wall across the compartment.

For instance, a plurality of such partition walls may be provided between the parallel side walls in order to provide a plurality of sub-compartments between the side walls. These may be in the form of closed sub-compartments. For instance, there may be a partition wall at each end of the parallel side walls to act as end walls closing off each end of the compartment.

The buttress or buttresses may extends across the compartment towards the second side wall to provide a partition wall extending across the compartment save for a gap between the buttress and the second side wall. Alternatively, the buttress may have a gap provided in it. This may lead to the buttresses providing a compartment which is nearly closed off, save for small gaps. The width of such small gaps may be of the order of the spacing between the discontinuous first domains, or less. For instance, with 2-D arrays where the spacing between adjacent discontinuous first domains is from say 20 to 60 nm, the gaps may have a size of say 5 to 50 nm, such as about 10 nm.

Suitably, the buttress may be shaped to engage with the 2-D array whereby the buttress replaces (i.e. stands in place of) one or more discontinuous first domains of the 2-D array.

The buttress may be in the form of a straight section of wall, for instance of similar width to the side wall, lying parallel to the wall or meeting the wall at an angle. The buttress may be formed into a chevron shape.

The buttress may comprise a straight section of wall where it joins the first sidewall such that an angle of about 60°, 120° or 90° is formed between the straight section of buttress wall and the first sidewall. The angle may be chosen to match the alignment of the rows of discontinuous first domains of the 2-D array that are not parallel to the Cartesian y axis.

The buttress may comprise one or more further graphoepitaxial nucleation features, as set out herein, so for instance may include an alcove(s), gap(s) and/or further buttresses, or may have two or more sections arranged to form an angled buttress.

In a suitable arrangement, the first side wall may comprise first and second parallel side wall portions offset relative to each other along the x axis, the graphoepitaxial nucleation feature being a discontinuity between the first and second portions. The offset distance may be less than the width of the sidewall, such that the sidewall may remain as a continuous sidewall.

Suitably, the first and second parallel side wall portions may be offset by $N \cdot L_x$ measured along the x axis, where N is an integer and $L_x$ is the pitch (i.e. spacing between the central axes) of the parallel rows of the 2-D array measured along the x-axis. N will typically be 1, 2, 3, 4 or 5. It should be noted that any transitional region, or "dead zone" as mentioned hereinbefore, will be taken into account in arranging the mutual spacing of the parallel side walls, and so does not have to be taken into account again when considering the offset in this arrangement according to an embodiment of the invention.

The second side wall may in addition or alternatively comprise first and second side wall portions, offset relative to each other, same as for the first side wall.

In a suitable arrangement, the graphoepitaxial nucleation feature may be a pillar within the compartment, extending upwards from the surface of the substrate and spaced from the side walls. This pillar may be of similar thickness to the side walls and may be of the same material.

The pillar is suitably shaped and positioned to engage with the 2-D array of self-assembled polymer such that the buttress replaces one or more discontinuous first domains of the 2-D array.

The pillar may further comprise one or more further graphoepitaxial nucleation features, so for instance may include one or more gaps, alcoves and/or further buttresses.

The graphoepitaxy template is suitably formed from a resist layer, wherein portions of the resist layer have been etched away to leave remaining features forming the graphoepitaxy template. The graphoepitaxy template may suitably be of hydrogen silsesquioxane. Any buttresses and/or pillars may be of the same material as the side walls of the template, suitably formed in a similar manner.

According to an aspect of the invention, there is provided a method of preparing a surface of a substrate for deposition of a self-assemblable block copolymer thereon, the method comprising forming a graphoepitaxy template as described herein on the surface of the substrate.

This aspect provides a method of preparing a surface of a substrate for deposition of a self-assemblable block copolymer thereon. The method comprises forming a graphoepitaxy template as described herein on the surface of the substrate. The graphoepitaxy template may include a plurality of side walls, defining compartments between adjacent pairs of parallel side walls, with the thus-formed compartments including one or more graphoepitaxial nucleation features as set out herein.

The side walls, and any buttresses and/or pillars of the graphoepitaxy template may suitably be provided on the substrate by:
applying a resist layer to the surface,
selectively exposing the resist layer to actinic radiation to provide exposed and unexposed regions of resist layer, and
removing the exposed region or the unexposed resist region with a developer to provide the surface having resist features of the remaining resist region thereon,
wherein the resist features form the side walls and any buttresses and/or pillars of the graphoepitaxy template.

According to an aspect of the invention, the side walls, and any buttresses of the graphoepitaxy template may be provided on the substrate by:
applying a resist layer to the surface,
making a first selective exposure of the resist layer to actinic radiation to provide first exposed regions of resist layer,
making a second selective exposure of the resist layer to actinic radiation to provide second exposed regions of resist layer, wherein the second exposed regions partially overlap with the first exposed regions, and wherein regions of the resist layer remain unexposed in both the first and second selective exposures, and
removing the unexposed resist regions with a developer to provide the surface having resist features of the remaining exposed resist regions thereon, wherein the resist features form the side walls and any buttresses of the graphoepitaxy template.

The buttresses may be formed by exposed regions of the resist layer which are only exposed in one of the first and second selective exposures.

According to an aspect of the invention, there is provided a method of aligning a self-assembled block polymer on a surface of a substrate, wherein the block copolymer is adapted to self-assemble into a 2-D array comprising parallel rows of discontinuous first domains extending parallel to a Cartesian y axis, mutually spaced along an orthogonal Cartesian x axis, and separated by a continuous second domain, the method comprising:
providing, on the surface of the substrate, a graphoepitaxy template as described herein;
depositing a self-assemblable block polymer composition into a compartment of the graphoepitaxy template; and
treating the self-assemblable polymer composition to provide self-assembly into the 2-D array of self-assembled block copolymer in the compartment.

This aspect provides a method of aligning a self-assembled block polymer on a surface of a substrate. The block copolymer is one adapted to self-assemble into a 2-D array comprising parallel rows of discontinuous first domains extending parallel to a Cartesian y axis, mutually spaced along an orthogonal Cartesian x axis, and separated by a continuous second domain. For instance the block copolymer may be adapted to self-assemble into a cylindrical 2-D array. The method comprises:
providing, on the surface of the substrate, a graphoepitaxy template as described herein,
depositing a self-assemblable block polymer composition into the compartment of the graphoepitaxy template, and
treating the self-assemblable polymer composition to provide self-assembly into the 2-D array of self-assembled block copolymer in the compartment.

The treatment to provide self-assembly of the block copolymer may involve annealing, cooling, loss of solvent by evaporation, or the like. The self-assemblable polymer will typically be deposited into the compartment in a disordered state, as a melt or solution. This may be achieved, for instance, by a process such as spin coating or the like.

According to an aspect of the invention, there is provided a lithography method of patterning a surface of a substrate by resist etching, wherein the method comprises providing a self-assembled block copolymer layer at the surface by a method described herein, wherein the self-assembled block copolymer layer is used as a resist layer.

This aspect provides a lithography method of patterning a surface of a substrate by resist etching. The method comprises providing a self-assembled block copolymer layer at the surface by a method described herein, wherein the self-assembled block copolymer layer is used as a resist layer. for instance, an etch may be used to remove one of the first or second domains of the 2-D array. Typically, the discontinuous domains may be used to provide conductive contacts by their removal and subsequent replacement by a deposited conductor on the surface of the substrate.

According to an aspect of the invention, there is provided a method of forming a device topography at a surface of a substrate, the method comprising using the self-assembled polymer layer formed by a method described herein as a resist layer while modifying the substrate to provide the device topography.

This aspect provides a method of forming a device topography at a surface of a substrate. The self-assembled polymer layer formed by a method described herein is used as a resist layer while modifying the substrate to provide the device topography. Modification of the substrate may, for instance, involve etching of the substrate or deposition of material onto the substrate using the self-assembled polymer layer, with one of the first or second domains removed, as a mask.

The following features are applicable to all the various aspects of the invention where appropriate. When suitable, combinations of the following features may be employed as part of the methods, apparatus and compositions herein, for instance as set out in the claims. The methods and graphoepitaxy templates herein are suitable for use in device lithography. For instance the methods and graphoepitaxy templates described herein may be used for treatment or formation of a resist layer of self-assembled polymer for use in patterning a device substrate directly or for use in patterning an imprint template for use in imprint lithography.

The self-assemblable polymer may be a block copolymer as set out hereinbefore comprising at least two different block types which are self-assemblable into an ordered polymer layer having the different block types associated into first and second domain types. The block copolymer may be a di-block copolymer or a tri-block or multi-block copolymer. Alternating or periodic block copolymers may be used as the self-assemblable polymer. Although only two domain types may be mentioned in some of the following aspects and examples, an embodiment of the invention is also applicable to a self-assemblable polymer with three or more different domain types.

In an embodiment, the self-assemblable polymer is a block copolymer comprising one or more first blocks of first monomer and one or more second blocks of second monomer. A useful polymer is a bi-block copolymer of PS (polystyrene)/PMMA (polymethylmethacrylate), adapted by selection of a ratio of relative volumes of blocks of PS/PMMA, to self-assemble into a 2-D cylindrical array when self-assembled on a substrate surface.

By chemical affinity, in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity.

In this specification, when reference is made to the thickness of a feature, the thickness is suitably measured by an appropriate means along an axis normal to the substrate surface and passing through the centroid of the feature. Thickness may suitably be measured by a technique such as interferometry or assessed through knowledge of etch rates.

Wherever mention is made of a "layer" in this specification, the layer referred to is to be taken to be layer of substantially uniform thickness, where present. By "substantially uniform thickness" is meant that the thickness does not vary by more than 10%, or by not more than 5%, of its average value across the layer.

BRIEF DESCRIPTION OF THE DRAWINGS

Specific embodiments of the invention will be described with reference to the accompanying figures, in which:

FIGS. 7, 8, 9, 10, 11, 12, 13 and 14 each depict plan views of a graphoepitaxy template according to an embodiment of the invention.

In FIG. 5 and in FIGS. 7 to 13, the 2-D array has not been shown—only the graphoepitaxy template is indicated. In FIG. 6, FIG. 14 and FIG. 15 row (d), the 2-D array is indicated by showing at least some of the aligned rows of discontinuous first domains within the compartments.

DETAILED DESCRIPTION

Figure 1A:
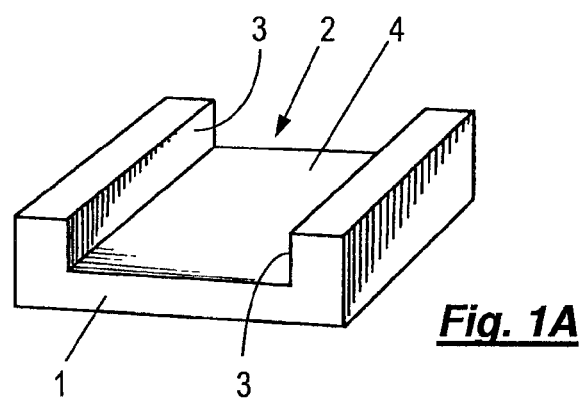
FIGS. 1A to 1C schematically depict directed self-assembly of A-B block copolymers onto a substrate by graphoepitaxy and formation of relief patterns by selective etching of one domain.
Figure 1B:
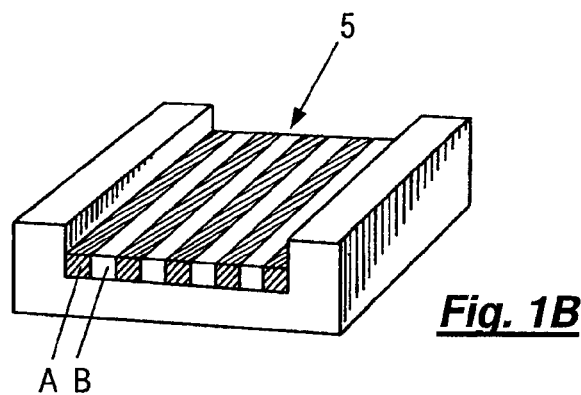
Figure 1C:
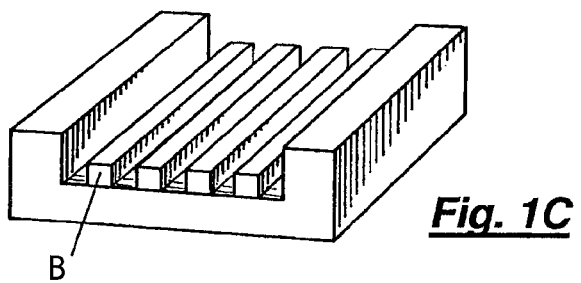

FIG. 1A shows a substrate 1 with a trench 2 formed therein bounded by side walls 3 and a bottom surface 4. In FIG. 1B, a self-assemblable A-B block copolymer with lyophilic (e.g., hydrophilic) A blocks and lyophobic (e.g., hydrophobic) B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the side wall 3, which is also lyophilic (e.g., hydrophilic). In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
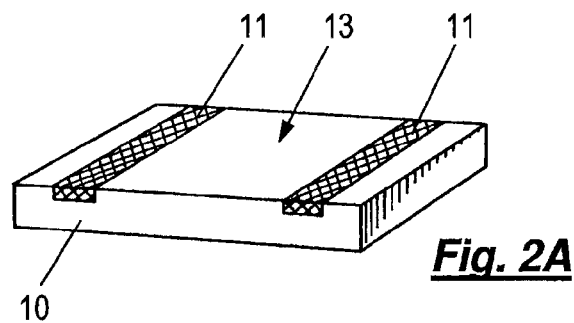
FIGS. 2A to 2C schematically depict directed self-assembly of A-B block copolymers onto a substrate by chemical pre-patterning and formation of relief patterns by selective etching of one domain.
Figure 2B:
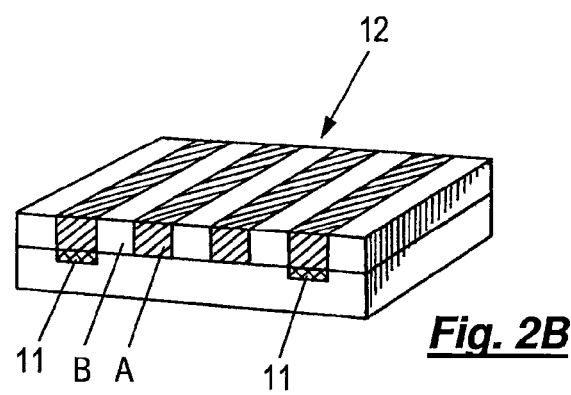
Figure 2C:
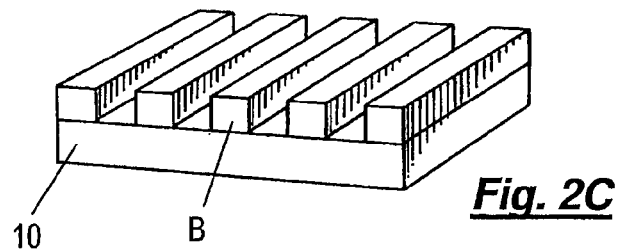

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with lyophilic (e.g., hydrophilic) A blocks and lyophobic (e.g., hydrophobic) B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A domains have nucleated atop the pinning stripes 11, which are also lyophilic (e.g., hydrophilic). In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

In the following, the di-block copolymer used as a self-assemblable polymer is poly(styrene-b-methylmethacrylate) block copolymer.

Figure 3A:
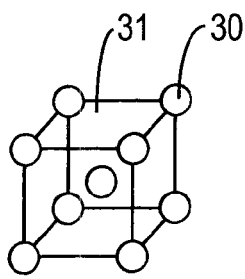
FIGS. 3A to 3E schematically depict the different phases formed by poly(styrene-b-methylmethacrylate) polymer as the relative volume fractions of the polystyrene and PMMA blocks are varied relative to each other.
Figure 3B:
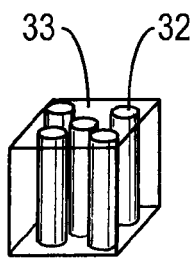

In FIG. 3, FIGS. 3A to 3B show the progression of different phases formed by a self-assembled poly(styrene-b-methylmethacrylate) block copolymer in thin films on a surface. In FIG. 3A, a cubic phase is shown with the discontinuous domains being spheres 30 of PMMA within a continuous domain 31 of PS for a ratio PS:PMMA of 80:20.

Figure 3C:
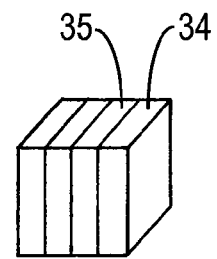
Figure 3D:
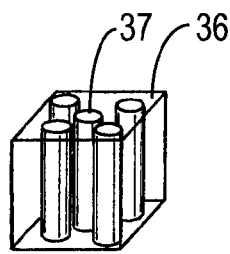
Figure 3E:
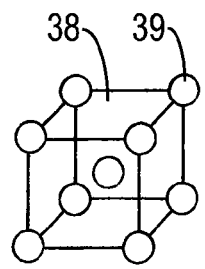

As the ratio PS:PMMA reduces to 70:30, a cylindrical phase is formed with the discontinuous domains being cylinders 32 of PMMA and a continuous domain 31 of PS. At 50:50 ratio, a lamellar phase is formed as shown in FIG. 3C with one or more lamellae 34 of PMMA and one or more lamellae 35 of PS. With a ratio of 30:70 PS:PMMA, an inverted cylindrical phase is formed, shown in FIG. 3D, with the discontinuous domains being cylinders 37 of PS and a continuous domain 36 of PS. At a ratio of 20:80, shown in FIG. 3E, an inverted cubic phase is formed with discontinuous domains being spheres 39 of PS within a continuous domain 38 of PMMA.

Figure 4A:
FIGS. 4A and 4B schematically depict a block copolymer forming a cylindrical phase as a 2-D array between side walls of a graphoepitaxy template.
Figure 4B:
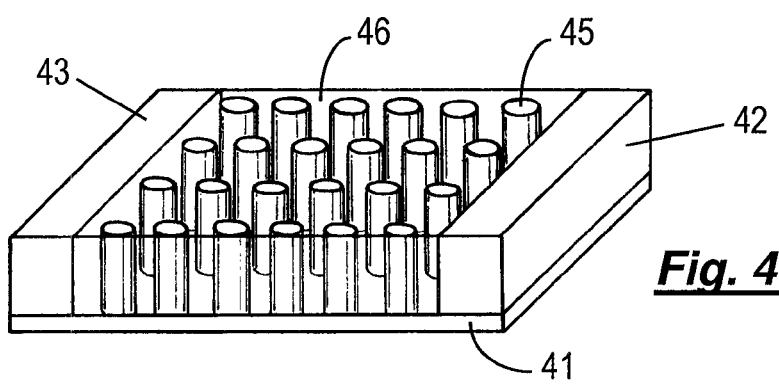

FIG. 4A depicts a poly(styrene-b-methylmethacrylate) block copolymer with a volume fraction ratio 70:30 of PS:PMMA. The polymer section 46 represents polystyrene with polymer section 45 representing PMMA. In FIG. 4B, this polymer is shown self-assembled into a 2-D array between side walls 42, 43 of a graphoepitaxy template on a substrate 41, with the PMMA 45 forming the discontinuous cylindrical domains and the polystyrene 46 forming the continuous domain surrounding the cylinders. The sidewalls of the graphoepitaxy template in this case have a high chemical affinity for the PMMA 45 which leads to this arrangement where the PMMA cylinders 45 are in rows spaced apart from the sidewalls by regions of second continuous phase of polystyrene 46.

For the following Figures, the block copolymer used to present an embodiment of the invention is a 70:30 PS:PMMA polymer adapted to self-assemble into a 2-D hexagonal cylindrical array, with discontinuous first domains lying in rows parallel to the y axis and forming further mutually parallel rows aligned at 60° (and) 120° to the y axis. Although this particular arrangement has been used to present an embodiment of the invention, it will be understood that the invention can be easily adapted for use with other 2-D arrays.

Figure 5:
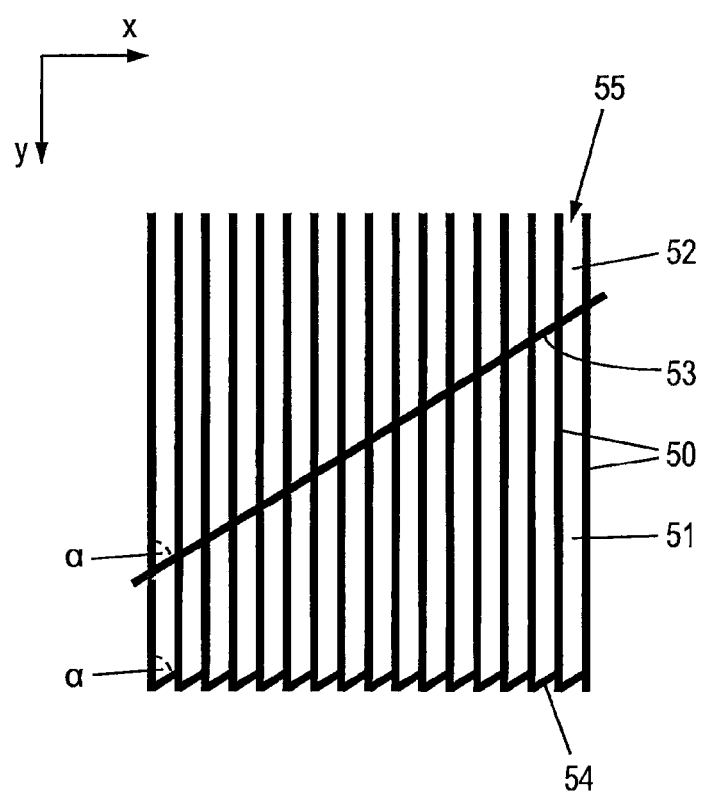
FIG. 5 shows a plan view of a plurality of compartments, formed between adjacent parallel side walls, according to an embodiment of a graphoepitaxy template according to an embodiment of the invention.

FIG. 5 shows a graphoepitaxy template according to an embodiment of the invention with a number of parallel side walls 50 forming a compartment 55 between the sidewalls. Between each pair of sidewalls, there is an end wall 54 set at an angle α of 60° to each first sidewall of each pair of sidewalls. A further line 53 of, e.g., resist provides a partition wall between each pair of sidewalls. This line 53 also sets at an angle α of 60° to the first sidewalls, and can be seen to provide a set of closed compartments 51 and a set of open ended compartments 52 within the graphoepitaxy template, with the walls lying suitable for alignment of a 2-D hexagonal array.

For each type of compartment, the corners of the compartments, formed between sidewalls and end walls or between sidewalls and partition walls, act as a graphoepitaxial nucleation feature, providing a location point to position discontinuous first domains of a 2-D array of self-assembled block copolymer. The spacing between the sidewalls and between the end and partition walls is arranged to enable the 2-D ordered array of self-assembled block copolymer to fit within the compartments without strain. Without wishing to be bound by theory, it is believed that the open ended compartments 52 may allow relaxation of strain, while nucleation can still be effective from the corners at the closed ends of the compartment, and that this may facilitate rapid annealing.

Figure 6A:
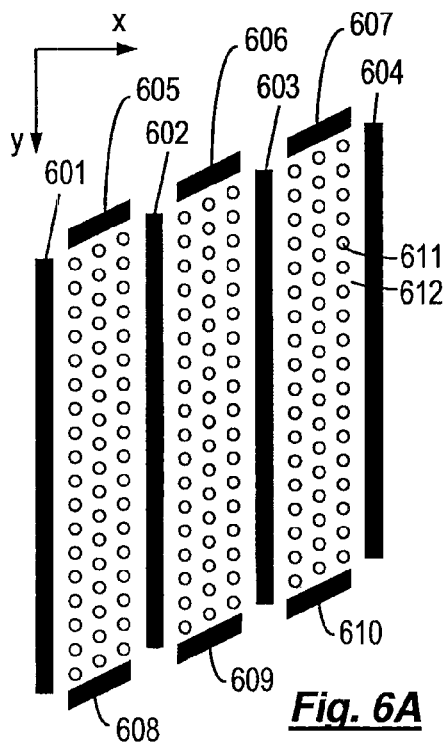
FIGS. 6A and 6B each depicts compartments formed between adjacent parallel side walls of a graphoepitaxy template according to an embodiment of the invention.

In FIG. 6A, four parallel sidewalls 601, 602, 603, 604 are shown forming 3 compartments, one compartment between each pair of adjacent side walls. The self-assembled 2-D polymeric is indicated within each compartment, with 3 parallel rows of discontinuous domains 611 in each compartment, separated by second continuous domain 612 aligned parallel to the side walls, and parallel to the y axis. Buttresses (605 to 610) are provided at the ends of each compartment, almost closing the ends save for small gaps between the buttress and each respective sidewall. For instance, for the compartment between sidewall 601 and 602, buttress 605 almost closes one end of the compartment with buttress 608 almost closing the other end of the same compartment. The buttresses 605, 608 are set at 60° to the first sidewall 601 in order to match the alignment of the 2-D array formed within the compartments by the hexagonal array of the self-assembled polymer. Particularly in case of a sharp angle between the buttresses 605, 608 and the first sidewall 601, for example a 60° angle, one of the advantages of having small gaps between the buttress and each respective sidewall is that it reduces the sensitivity to a deviation in the angle from a desired angle.

Figure 6B:
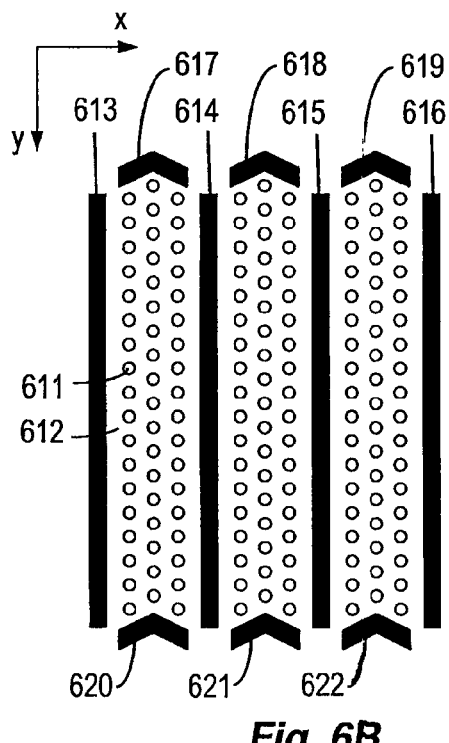

In FIG. 6B, a similar arrangement is shown with four mutually parallel sidewalls 613, 614, 615, 616 also arranged to provide three compartments. In the embodiment of FIG. 6B the buttresses 617, 618, 619, 620, 621, 622 are in the form of chevrons, and dimensioned to match the alignment of the discontinuous phase domains within the ordered, self-assembled polymer in the respective compartments. Once again, there is a gap provided between the buttresses and the respective sidewalls which may permit strain relief. The gaps provided between the buttresses and the sidewalls may be of the order of say 10 nm. An advantage arising from the presence of the gaps at the corners of the compartments is that scum formation during deposition of the disordered self-assembled polymer into the compartments is mitigated. With closed compartments, there is a tendency for scum to gather at the corners whereas with open corners collection of scum at the nucleation sites may be reduced or eliminated.

A further embodiment according to the invention (not shown) is similar to the arrangement shown in FIG. 6B, but with the buttresses 620, 621, 622 in the form of chevrons arranged such that the tip of the chevrons does not point in minus y-direction, but in the y-direction. Again, the buttresses 617, 618, 619, 620, 621, 622 in the form of chevrons are dimensioned to match the alignment of the discontinuous phase domains within the ordered, self-assembled polymer in the respective compartments. In an embodiment no gap is provided between the buttresses and the respective sidewalls.

Figure 7:
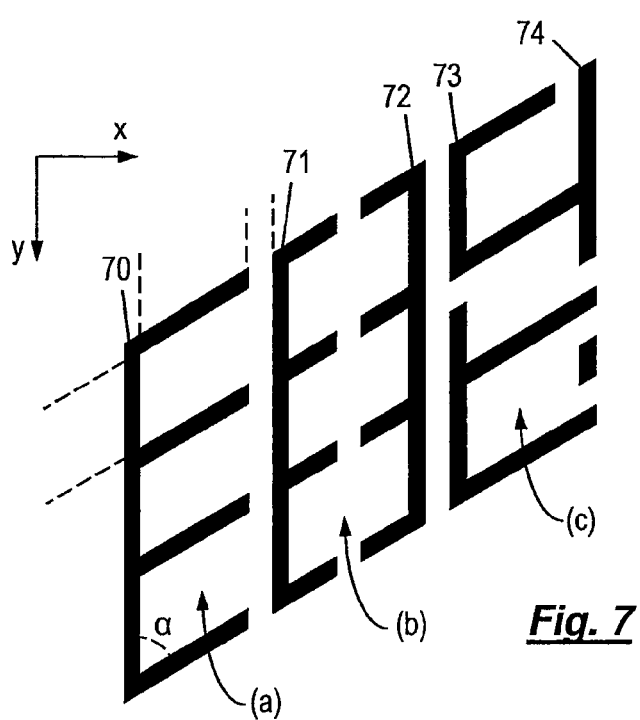

FIG. 7 shows a graphoepitaxy template arrangement demonstrating a number of different arrangements of graphoepitaxial nucleation features. In compartment (a), buttresses extend from the first side wall 70 to within a short distance of second side wall 71. In compartment (b) buttresses extend inwards from each side 71, 72 wall, to effectively form a set of partition walls with central gaps. The portion (c) shows a compartment arrangement with a number of sub-compartments each provided with gaps in the side walls 73, 74 or end wall.

Figure 8:
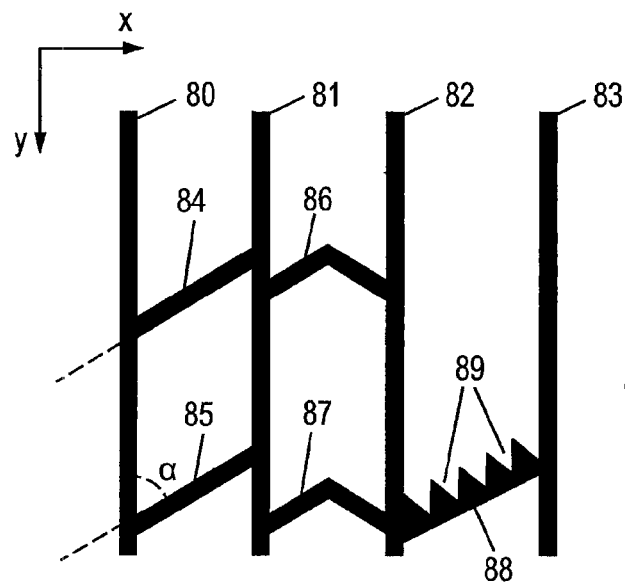

FIG. 8 shows another varied configuration, with straight partition walls 84, 85 between side walls 80, 81, or chevron partition walls 86, 87 between side walls 81, 82 and a partition wall 88 between side walls 82, 83 provided with one or more alcoves 89 in the form of serrations spaced to align the discontinuous domains of an ordered 2-D array of self-assembled block copolymer.

Figure 9:
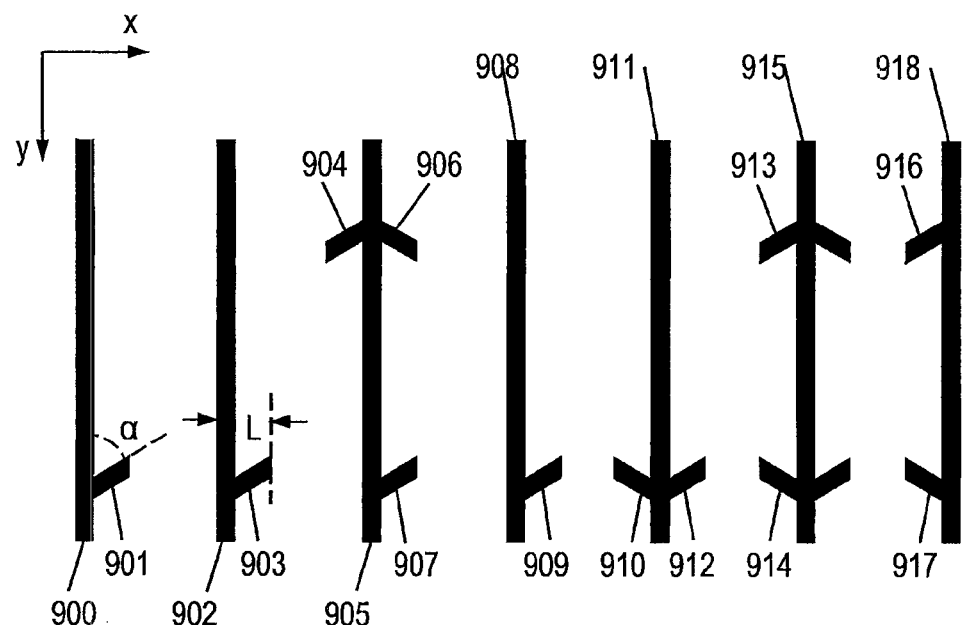

FIG. 9 shows the use of short buttresses 901, 903, 904, 906, 907, 909, 910, 912, 913, 914, 916, 917 from respective side walls 900, 902, 905, 908, 911, 915, 918, as graphoepitaxial nucleation features. The buttresses are straight buttresses arranged to replace a single discontinuous domain of a 2-D hexagonal array as it nucleates between the respective side walls, and so to positionally locate the 2-D array.

Figure 10A:
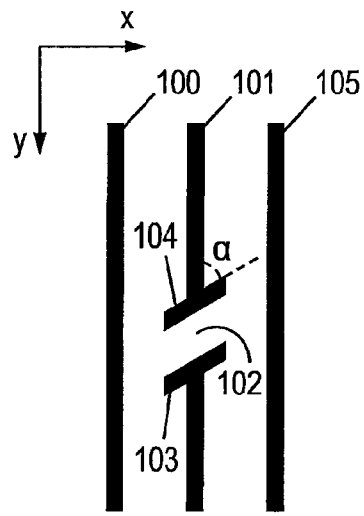
Figure 10B:
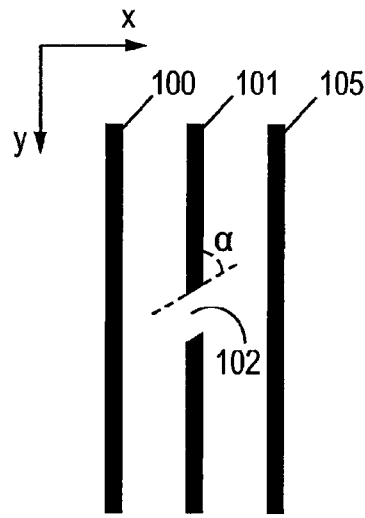

FIG. 10A shows a combination of nucleation features including a gap 102 in a side wall 101 accompanied by buttresses 103, 104 extending into adjacent compartments at the gap and toward the respective side walls 100, 105. FIG. 10B shows an arrangement where a gap 102 alone in side wall 101 is used as nucleation feature.

Figure 11:
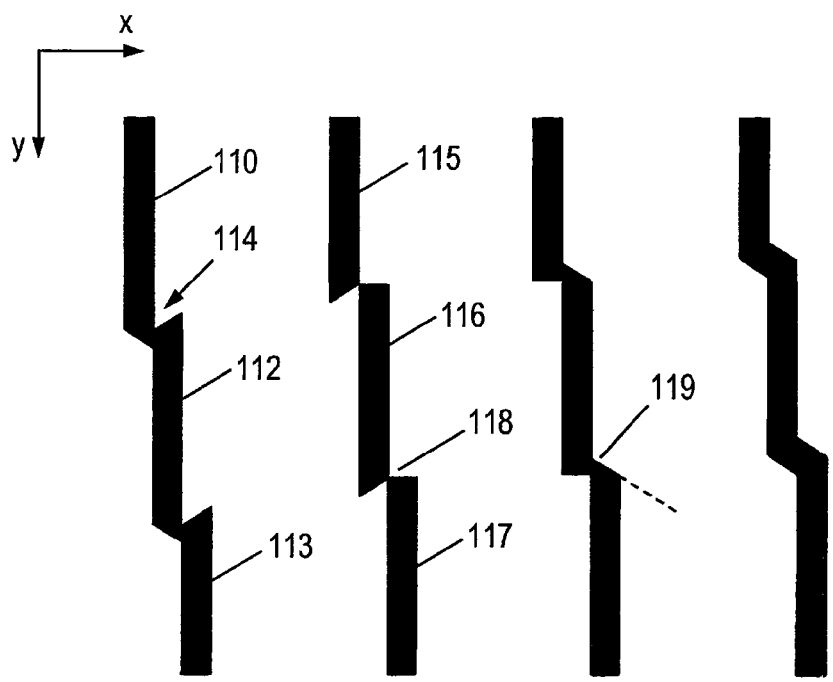

FIG. 11 shows an arrangement of side walls where each side wall has three portions (110, 112, 133 and 115, 116, 117), each portion mutually parallel to the other portions, but offset along the x-axis. So, for the leftmost side wall of FIG. 11, the portion 110 is offset from portion 112, forming an angle 114 as a nucleation feature (in this case 60°). A similar arrangement is shown for the adjacent side wall to the right where portion 116 is offset from portion 117 to form an angle 118 as nucleation feature (in this case 90°). In the next side wall along to the right, a nucleation feature 119 which is a 120° angle is demonstrated at an offset between side-wall portions.

Figure 12A:
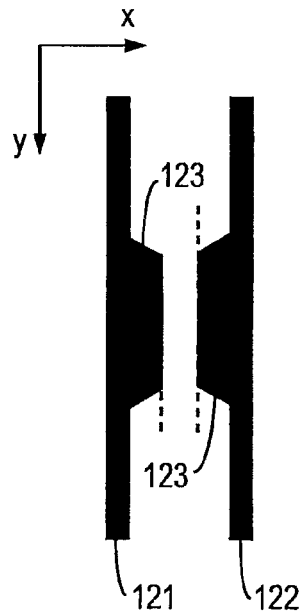
Figure 12B:
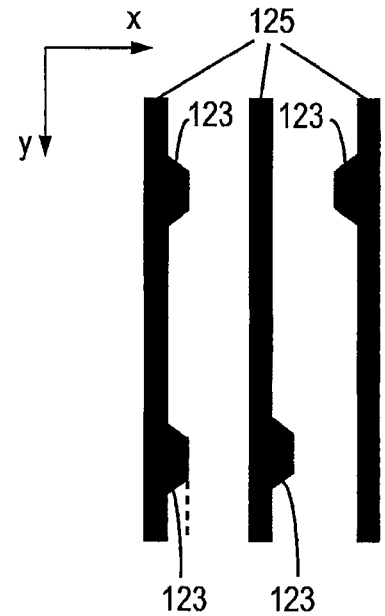
Figure 12C:
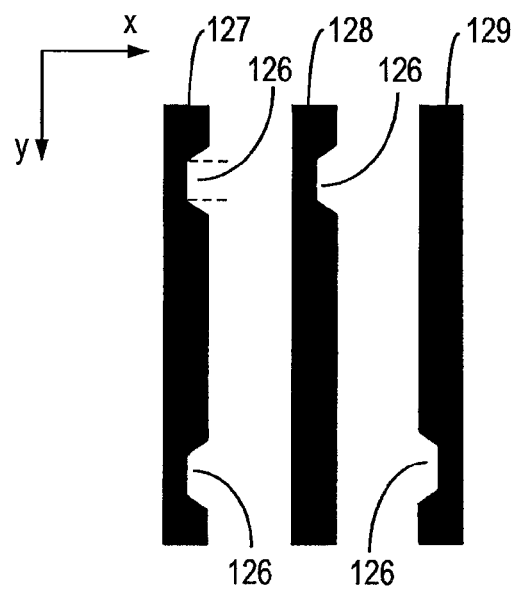

FIGS. 12A and 12B show a further use of one or more buttresses 123 attached to or adjacent side walls 121, 122, 125 as nucleation features. In this embodiment, the buttresses 123 are sized so that they may replace a number of discontinuous domains of the 2-D hexagonal array to act as a nucleation feature without straining the resulting array. In FIG. 12C one or more alcoves 126 of side walls 127, 128, 129 are present as nucleation features.

Further exemplification of the use of alcoves 132 of a side wall 131 as nucleation features is shown in FIG. 13. The alcoves are shown spaced apart by a distance L along the side wall 131 where $L=N \cdot L_y$, or for the partition wall 133, the spacing is set to correspond to the pitch $L_x$ of the parallel rows of the discontinuous domains. Further, alcoves 132 on adjacent side walls can be spaced relative each other at an angle α of, e.g., 60°.

In FIG. 14, pillars 147 are provided situated between the side walls 141, 142, 143, 145, 146 at locations where they are positioned and dimensioned fit into the 2-D array of discontinuous domains 148 among a continuous domain 149, with each pillar 147 effectively replacing a discontinuous first domain 148 and so each pillar may act as an aligned nucleation site. Even if nucleation is initiated from a plurality of pillars, the alignment of the pillars should help ensure that the resulting self-assembled 2-D array is aligned. Because of a possibility for the block copolymer to form a transitional region, or "dead zone" of width d at the interface with a graphoepitaxy feature, as explained hereinbefore, the size of the pillars may be arranged in order to take this phenomenon into account.

In a preferred embodiment according to the invention the graphoepitaxy template combines the use of graphoepitaxial nucleation features which replace single discontinuous domains of a 2-D hexagonal array with graphoepitaxial nucleation features which provide location points to position discontinuous first domains of the 2-D array. For example, a graphoepitaxy template according to the invention (not shown) combines the use of short buttresses like 901, 903, 904, 906, 907, 909, 910, 912, 913, 914, 916, 917 as described above in relation to FIG. 9 as graphoepitaxial nucleation features which replace single discontinuous domains of a 2-D hexagonal array with the use of the corners of compartments as described in relation to FIG. 5 as graphoepitaxial nucleation features which provide location points to position discontinuous first domains of the 2-D array. Instead of the corners of compartments as described in relation to FIG. 5 also other type of graphoepitaxial nucleation features which provide location points to position discontinuous first domains of the 2-D array may be used. For example any of the applicable graphoepitaxial nucleation features described or shown above may be used, like the graphoepitaxial nucleation features of FIG. 6A or FIG. 6B. Also, instead of the short buttresses as described in relation to FIG. 9 also other type of graphoepitaxial nucleation features which replace single discontinuous domains of a 2-D hexagonal array may be used. Also other combinations of graphoepitaxial nucleation features are possible, like the combination of the alcoves 132 as shown in FIG. 13 with the graphoepitaxial nucleation features of FIG. 6A or FIG. 6B (with or without a gap between the buttresses and the respective sidewalls). An advantage of combining types of graphoepitaxial nucleation features as described above is that it further improves how well the discontinuous first domains are precisely evenly spaced along the y axis.

For the embodiments of graphoepitaxy template shown in FIGS. 5 to 14, the templates may suitably be provided on the substrate by deposition of a resist layer on the substrate and subsequently etching the resist layer to remove some of the resist layer leaving the pattern of the graphoepitaxy template as residual resist features on the surface of the substrate.

In an embodiment, the templates may be formed by electron-beam lithography of a layer, such as a resist layer.

Figure 15:
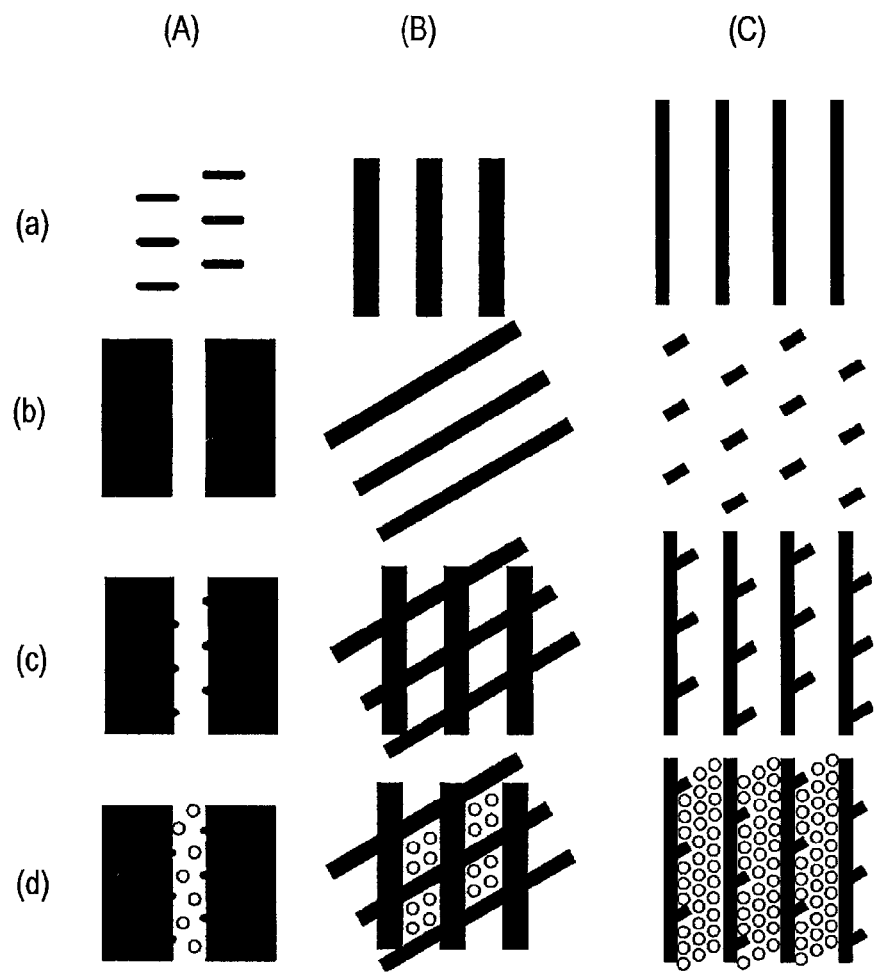
FIG. 15 shows, in columns (A), (B) and (C), stages for the formation of a graphoepitaxy template according to embodiments of the invention, by use of dual exposure photolithography, in rows (a) to (c), with self-assembly into the resulting template schematically depicted in row (d).

In FIG. 15, each of the columns (A), (B) and (C) shows the formation of a different graphoepitaxy template, in each case, by means of dual-exposure photolithography, with the last row in each column showing self-assembly of the block copolymer aligned within the templates in row (d) of each column.

For each of the embodiments in FIG. 15, columns (A), (B) and (C), a pair of overlapping photolithography exposures is made onto a resist, with the first exposure as shown in row (a) and the second exposure as shown in row (b), whereby the combined, resulting exposure provides a template according to embodiments of the invention, once the exposed resist has been developed, for each example. The method allows simple masks to be employed, with the graphoepitaxy template formed by overlap of the patterns (a) and (b), giving the resulting graphoepitaxy template as shown in row (c). The resulting graphoepitaxy template may thus include nucleation features in the form of buttresses having dimensions that would otherwise be smaller than the resolution available by conventional photolithography using a single mask and a single exposure to actinic radiation. Row (d) of each column shows how the resulting graphoepitaxy template may be used for alignment of self-assembly of a block copolymer.

The described and illustrated embodiments are to be considered as illustrative and not restrictive in character, it being understood that only preferred embodiments have been shown and/or described and that all changes and modifications that come within the scope of the inventions as defined in the claims are desired to be protected. For instance, although the examples relate to a self-assemblable polymer adapted to assemble into a hexagonal 2-D array, the polymer used may for instance instead be one adapted to self-assemble into a rectangular, square or face-centered 2-D array, with the graphoepitaxy template modified to feature end walls, pillars or buttresses set at 90° to the side walls, rather than say 60° or 120°. Also, the angle set between the side walls and end walls, pillars or buttresses (for example angle α in FIG. 8) influences how well the discontinuous first domains are precisely evenly spaced along the y axis direction. Particularly good results are achieved with end walls, pillars or buttresses set at an angle between 60° and 80° to the side walls. Even better results are achieved with end walls, pillars or buttresses set at an angle between 65° and 75° to the side walls, like 66° or 72°.

An embodiment of the present invention relates to lithography methods. The methods may be used in processes for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication of integrated circuits, bit-patterned media and/or discrete track media for magnetic storage devices (e.g. for hard drives).

In particular, an embodiment of the invention is of use for high resolution lithography, where features patterned onto a substrate have a feature width or critical dimension of about 1 μm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. Lithographic apparatus therefore usually includes an alignment apparatus, which may be used to align each pattern with a previously provided pattern, and/or with alignment marks provided on the substrate.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

In this specification, the term "substrate" is meant to include any surface layers forming part of the substrate, or being provided on a substrate, such as other planarization layers or anti-reflection coating layers which may be at, or form, the surface of the substrate.

The invention claimed is:

1. A graphoepitaxy template on a substrate, to align a self-assembled block polymer on a surface of the substrate, wherein the block copolymer is adapted to self-assemble into a 2-D array comprising parallel rows of discontinuous first domains extending parallel to a Cartesian y axis, mutually spaced along an orthogonal Cartesian x axis, and separated by a continuous second domain, the graphoepitaxy template comprising:
    first and second substantially parallel side walls extending parallel to and defining the y axis and mutually spaced along the x axis to provide a compartment adapted to hold at least one row of discontinuous first domains on the substrate between and parallel to the first and second side walls, and separated therefrom by the continuous second domain,
    wherein the compartment comprises a graphoepitaxial nucleation feature arranged to locate at least one of the discontinuous first domains at a specific position within the compartment, the graphoepitaxial nucleation feature comprising (i) a plurality of alcoves in the first side wall and/or second side wall, the alcoves being recesses in a same surface of the first side wall and/or of the second side wall such that portions of the respective first side wall and/or second wall that are substantially parallel to the other of the first side wall and/or second wall extend on opposite sides of at least one of the recesses, or (ii) a buttress extending into the compartment from the first side wall but not reaching the second side wall, or (iii) a pillar within the compartment, extending out from the surface of the substrate and spaced from the first and second side walls, or (iv) a discontinuity between first and second parallel side wall portions of the first sidewall that are offset relative to each other along the x axis, or (v) any combination selected from (i)-(iv).

2. The graphoepitaxy template of claim 1, wherein the graphoepitaxial nucleation feature comprises the alcoves in the first side wall and/or second side wall.

3. The graphoepitaxy template of claim 2, wherein each of the alcoves is shaped to hold at least one discontinuous first domain therein.

4. The graphoepitaxy template of claim 1, wherein the graphoepitaxial nucleation feature comprises the buttress extending into the compartment from the first side wall.

5. The graphoepitaxy template of claim 4, wherein the buttress extends across the compartment towards the second side wall to provide a partition wall extending across the compartment save for a gap between the buttress and the second side wall.

6. The graphoepitaxy template of claim 4, wherein the buttress is shaped to engage with the 2-D array such that the buttress replaces one or more discontinuous first domains of the 2-D array.

7. The graphoepitaxy template of claim 4, wherein the buttress comprises a straight section where it joins the first sidewall such that an angle of between 60° and 80° is formed between the straight section of the buttress and the first sidewall.

8. The graphoepitaxy template of claim 4, wherein the buttress comprises a further graphoepitaxial nucleation feature.

9. The graphoepitaxy template of claim 1, wherein the graphoepitaxial nucleation feature comprises the discontinuity between first and second parallel side wall portions of the first sidewall that are offset relative to each other along the x axis.

10. The graphoepitaxy template of claim 9, wherein the first and second parallel side wall portions are offset by $N \cdot L_x$ measured along the x axis, where N is an integer and $L_x$ is a pitch of the parallel rows of the 2-D array along the x-axis.

11. The graphoepitaxy template of claim 1, wherein the graphoepitaxial nucleation feature comprises the pillar within the compartment, extending out from the surface of the substrate and spaced from the first and second side walls.

12. The graphoepitaxy template of claim 11, wherein the pillar is shaped and positioned to engage with the 2-D array such that the pillar replaces one or more discontinuous first domains of the 2-D array.

13. The graphoepitaxy template of claim 11, wherein the pillar comprises a further graphoepitaxial nucleation feature.

14. The graphoepitaxy template of claim 1, wherein the graphoepitaxy template is of hydrogen silsesquioxane.

15. A method of preparing a surface of a substrate for deposition of a self-assemblable block copolymer thereon, the method comprising:
forming a graphoepitaxy template on the surface of the substrate, the graphoepitaxy template configured to align a self-assembled block polymer on the surface of the substrate, wherein the block copolymer is adapted to self-assemble into a 2-D array comprising parallel rows of discontinuous first domains extending parallel to a Cartesian y axis, mutually spaced along an orthogonal Cartesian x axis, and separated by a continuous second domain, the graphoepitaxy template comprising:
first and second substantially parallel side walls extending parallel to and defining the y axis and mutually spaced along the x axis to provide a compartment adapted to hold at least one row of discontinuous first domains on the substrate between and parallel to the first and second side walls, and separated therefrom by the continuous second domain,
wherein the compartment comprises a graphoepitaxial nucleation feature arranged to locate at least one of the discontinuous first domains at a specific position within the compartment, the graphoepitaxial nucleation feature comprising (i) a plurality of alcoves in the first side wall and/or second side wall, the alcoves being recesses in a same surface of the first side wall and/or of the second side wall such that portions of the respective first side wall and/or second wall that are substantially parallel to the other of the first side wall and/or second wall extend on opposite sides of at least one of the recesses, or (ii) a buttress extending into the compartment from the first side wall but not reaching the second side wall, or (iii) a pillar within the compartment, extending out from the surface of the substrate and spaced from the first and second side walls, or (iv) a discontinuity between first and second parallel side wall portions of the first sidewall that are offset relative to each other along the x axis, or (v) any combination selected from (i)-(iv).

16. The method of claim 15, wherein the first and second side walls of the graphoepitaxy template are provided on the substrate by:
applying a resist layer to the surface,
selectively exposing the resist layer to actinic radiation to provide exposed and unexposed regions of resist layer, and
removing the exposed resist region or the unexposed resist region with a developer to provide the surface having resist features of the remaining resist region thereon,
wherein the resist features form the first and second side walls of the graphoepitaxy template.

17. The method of claim 15, wherein the first and second side walls of the graphoepitaxy template are provided on the substrate by:
applying a resist layer to the surface,
making a first selective exposure of the resist layer to actinic radiation to provide first exposed regions of resist layer,
making a second selective exposure of the resist layer to actinic radiation to provide second exposed regions of resist layer, wherein the second exposed regions partially overlap with the first exposed regions, and wherein regions of the resist layer remain unexposed in both the first and second selective exposures, and
removing the unexposed resist regions with a developer to provide the surface having resist features of the remaining exposed resist regions thereon, wherein the resist features form the first and second side walls of the graphoepitaxy template.

18. The method of claim 17, wherein the graphoepitaxial nucleation feature comprises the buttress extending into the compartment from the first side wall and the buttress is formed by an exposed region of the resist layer which is only exposed in one of the first and second selective exposures.

19. A method of aligning a self-assembled block polymer on a surface of a substrate, wherein the block copolymer is adapted to self-assemble into a 2-D array comprising parallel rows of discontinuous first domains extending parallel to a Cartesian y axis, mutually spaced along an orthogonal Cartesian x axis, and separated by a continuous second domain, the method comprising:

providing, on the surface of the substrate, a graphoepitaxy template, the graphoepitaxy template configured to align the self-assembled block polymer on the surface of the substrate, the graphoepitaxy template comprising:

first and second substantially parallel side walls extending parallel to and defining the y axis and mutually spaced along the x axis to provide a compartment adapted to hold at least one row of discontinuous first domains on the substrate between and parallel to the first and second side walls, and separated therefrom by the continuous second domain, wherein the compartment comprises a graphoepitaxial nucleation feature arranged to locate at least one of the discontinuous first domains at a specific position within the compartment, the graphoepitaxial nucleation feature comprising (i) a plurality of alcoves in the first side wall and/or second side wall, the alcoves being recesses in a same surface of the first side wall and/or of the second side wall such that portions of the respective first side wall and/or second wall that are substantially parallel to the other of the first side wall and/or second wall extend on opposite sides of at least one of the recesses, or (ii) a buttress extending into the compartment from the first side wall but not reaching the second side wall, or (iii) a pillar within the compartment, extending out from the surface of the substrate and spaced from the first and second side walls, or (iv) a discontinuity between first and second parallel side wall portions of the first sidewall that are offset relative to each other along the x axis, or (v) any combination selected from (i)-(iv), depositing a self-assemblable block polymer composition into the compartment of the graphoepitaxy template, and treating the self-assemblable polymer composition to provide self-assembly into the 2-D array of self-assembled block copolymer in the compartment.

20. A lithography method of patterning a surface of a substrate by resist etching, wherein the method comprises providing a self-assembled block copolymer layer at the surface by the method of claim 19, wherein the self-assembled block copolymer layer is used as a resist layer.

21. A method of forming a device topography at a surface of a substrate, the method comprising using the self-assembled polymer layer formed by the method of claim 19 as a resist layer while etching the substrate to provide the device topography.

22. The method of claim 19, wherein the graphoepitaxial nucleation feature comprises the buttress extending into the compartment from the first side wall.

23. The graphoepitaxy template of claim 1, further comprising a closed compartment between first and second substantially parallel side walls, the closed compartment comprising a graphoepitaxial nucleation feature spanning the space between the first and second substantially parallel side walls to close the closed compartment.

* * * * *